United States Patent [19]

Abe

[11] Patent Number: 5,025,259
[45] Date of Patent: Jun. 18, 1991

[54] ANALOG-TO-DIGITAL CONVERSION SYSTEM FOR AN ELECTRONIC CONTROL SYSTEM OF A MOTOR VEHICLE

[75] Inventor: Kunihiro Abe, Higashimurayama, Japan

[73] Assignee: Fuji Jukogyo Kabushiki Kaisha, Tokyo, Japan

[21] Appl. No.: 462,585

[22] Filed: Jan. 9, 1990

[30] Foreign Application Priority Data

Jan. 19, 1989 [JP] Japan .................................. 1-010679

[51] Int. Cl.⁵ ............................................. H03M 1/06
[52] U.S. Cl. .................................... 341/118; 341/165
[58] Field of Search ............... 341/118, 120, 122, 155, 341/156, 158, 119, 123, 139, 159, 160, 165

[56] References Cited

U.S. PATENT DOCUMENTS 4,736,189 4/1988 Katsumata et al. ................. 341/120

FOREIGN PATENT DOCUMENTS 59-49351 3/1984 Japan .

Primary Examiner—J. R. Scott
Assistant Examiner—Brian Young
Attorney, Agent, or Firm—Martin A. Farber

[57] ABSTRACT

An analog/digital converter for converting analog output signals to digital values. The difference between the converted digital value and a reference digital value obtained at the last routine of the program is calculated. In accordance with the difference the closer digital value to the reference value is selected and the closer digital value is set as a proper digital value.

5 Claims, 4 Drawing Sheets

ANALOG-TO-DIGITAL CONVERSION SYSTEM FOR AN ELECTRONIC CONTROL SYSTEM OF A MOTOR VEHICLE

BACKGROUND OF THE INVENTION

The present invention relates to an analog-to-digital (A/D) conversion system provided in an electronic control system for controlling operation of an automotive engine.

Recently, motor vehicles have been equipped with an electronic control system for controlling various devices of an engine, such as fuel injectors and spark plugs, thereby improving exhaust gas emission, fuel consumption and engine power. The electronic control system controls the devices based on information represented by output signals from various sensors which detect engine operating conditions. Although sensors such as a crank angle sensor and a vehicle speed sensor generate digital signals, other sensors such as an intake air quantity sensor, a throttle position sensor and a coolant temperature sensor produce analog signals. The analog signals must be converted into digital signals so as to be processed in the electronic control system.

Japanese Patent Application Laid-Open No. 59-49351 discloses a method for converting the analog signals of the sensors into digital signals. In that method, analog values representing an offset voltage and a reference voltage are consecutively converted to digital values before A/D conversion of the analog signals from the sensors, at least at the start of the engine control operation. A correction coefficient is calculated based on the obtained digital values of the offset voltage and the reference voltage. Digital values converted by an A/D converter, which correspond to the analog value detected by the sensors, are corrected with the correction coefficient.

However, the output signals of the sensors provided on the motor vehicle are affected a lot by various electronic noises such as spark noise generated from contacts of switches, switching noise generated when transistors go ON and OFF, spark noise in an ignition system, noises produced at the brushes of a motor and noise produced when external magnetic fields generated by starting current and alternator current cause electromagnetic induction. If analog signals containing such noise are digitized, errors occur in the control operation, causing malfunctioning of the fuel injection system, ignition system, and other systems. Since the peak voltages of the noise are relatively high, the afore-described conventional system cannot eliminate the influence of the noise.

In order to produce an accurate digital value, the noises are usually eliminated with a noise filter. However, the noise which occurs in a motor vehicle has a large peak voltage so that the time constant of the noise filter is set to a large value. As a result, the response of the filter to the analog signal consequently is delays, resulting in distortion of the waveform of the signal. Thus, the digital value obtained by the conversion does not coincide with the analog signal causing malfunctioning of the control system.

SUMMARY OF THE INVENTION

The object of the present invention is to provide an A/D conversion system for an electronic system of a motor vehicle where an accurate conversion may be accomplished by eliminating the influence of noise without delay.

Other objects and features of this invention will become understood from the following description with reference to the accompanying drawings.

DETAILED DESCRIPTION OF THE PREFERRED EMBODIMENTS

Figure 1:
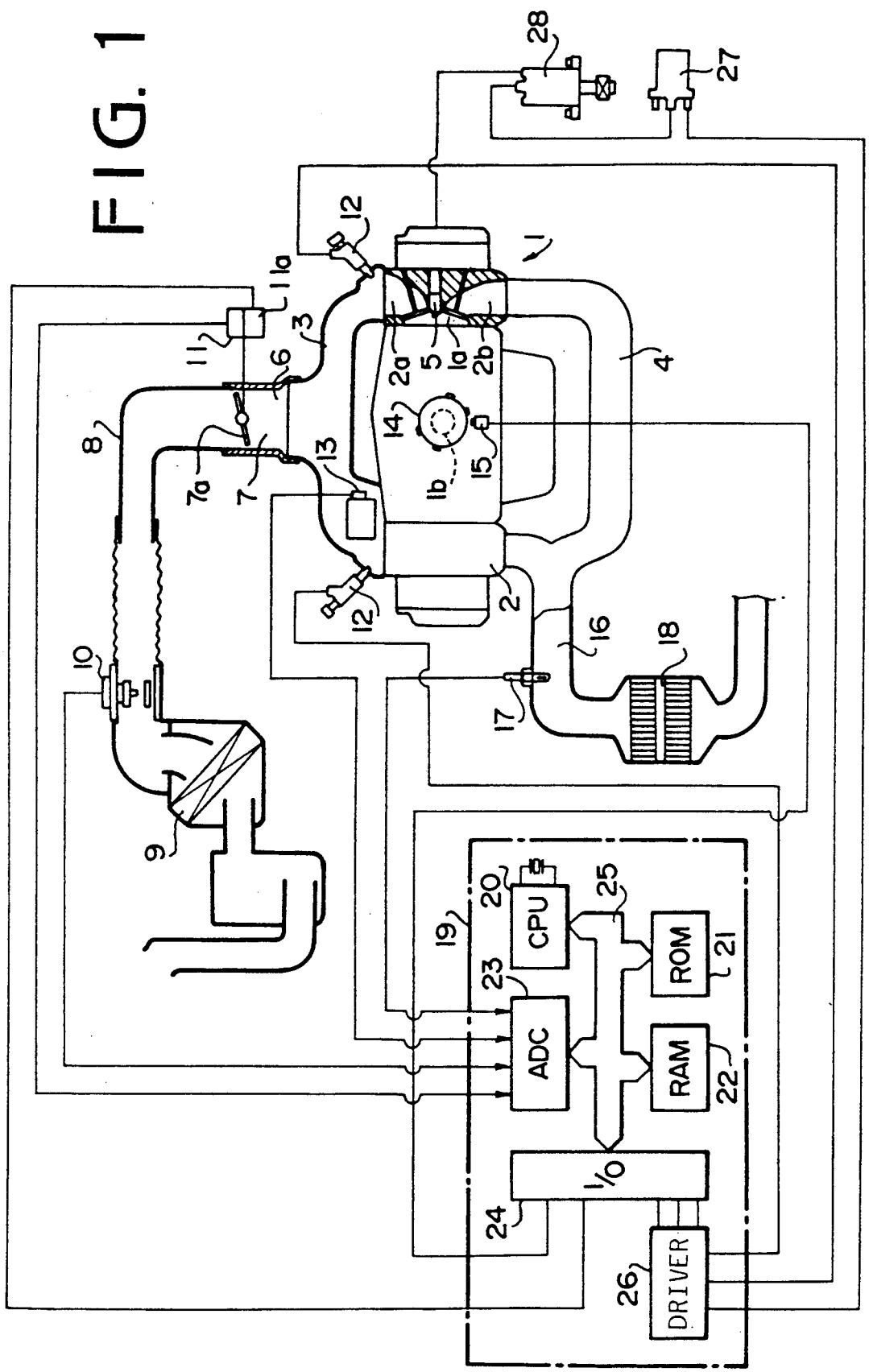
FIG. 1 is a schematic illustration of an electronic control system of an automotive engine.

Referring to FIG. 1 showing a horizontal opposite type four-cylinder engine 1, each cylinder head 2 of the engine 1 has intake ports 2a and exhaust ports 2b which are communicated with an intake manifold 3 and an exhaust manifold 4, respectively. A spark plug 5 is located in each combustion chamber 1a formed in the cylinder head 2. A throttle chamber 7 having a throttle valve 7a is communicated with the intake manifold 3 through an air chamber 6. The throttle chamber 7 is communicated with an air cleaner 9 through an intake pipe 8.

An intake air quantity sensor 10 (hot wire type air flow meter) is provided in the intake pipe 8 downstream of the air cleaner 9. A throttle position sensor 11 is provided for detecting the opening degree of the throttle valve 7a and an idle switch 11a is connected to the throttle position sensor 11 to detect the opening state or closing state of the throttle valve 7a. Fuel injectors 12 are provided in the intake manifold 3 upstream of the intake ports 2a. A coolant temperature sensor 13 is provided in a coolant jacket (not shown) of the engine 1. A crankshaft disk 14 having projections or slits on the periphery thereof representing predetermined crank angles is secured to a crankshaft 1b of the engine 1. A crank angle sensor 15 (magnetic pickup) is provided adjacent the crankshaft disk 14.

An $O_2$-sensor 17 and a catalytic converter 18 are provided in an exhaust passage 16 communicated with the exhaust manifold 4.

An electronic control unit 19 comprising a microcomputer has a CPU 20, a ROM 21, a RAM 22, an analog-to-digital converter (ADC) 23 and an input/output interface 24, which are connected to each other through a bus line 25.

Sensors such as the idle switch 11a and the crank angle sensor 15 are connected to an input port of the input/output interface 24. An analog sensor group 29 (FIG. 2) comprises the intake air quantity sensor 10, the throttle position sensor 11, the coolant temperature sensor 13 and the $O_2$-sensor 17, each of which produces a continuously changing analog signal. The signals are fed to the ADC 23 so as to be converted into digital signals before being applied to the input/output interface 24.

Control programs and fixed data such as an ignition timing map are stored in the ROM 21. Output signals of the sensors are stored in the RAM 22. The CPU 20 calculates the fuel injection pulse width and the ignition timing in accordance with the control programs in the ROM 21 and based on various data in the RAM 22.

Figure 2:
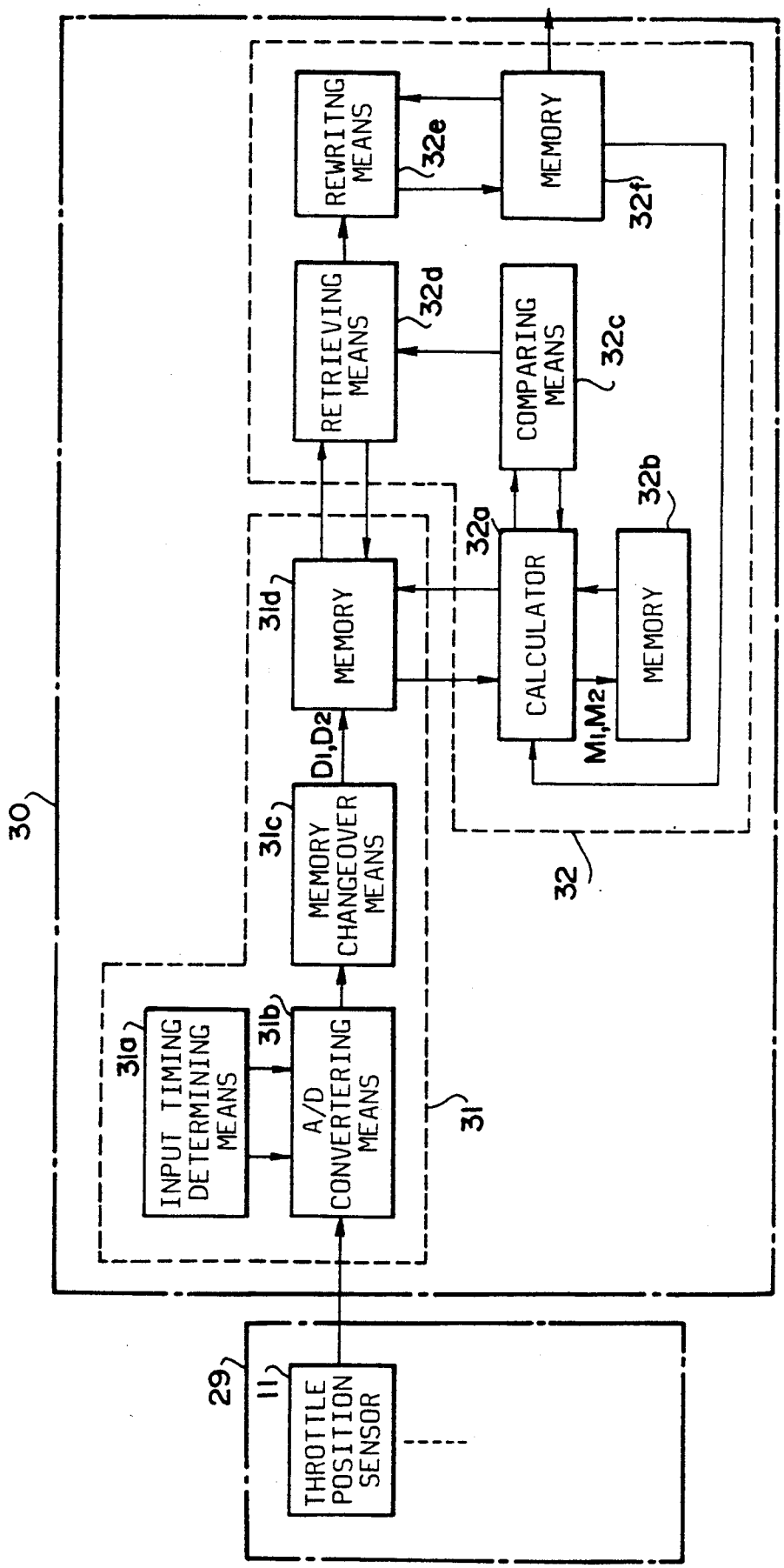
FIG. 2 is a block diagram showing a main part of the system of the present invention.
Figure 3:
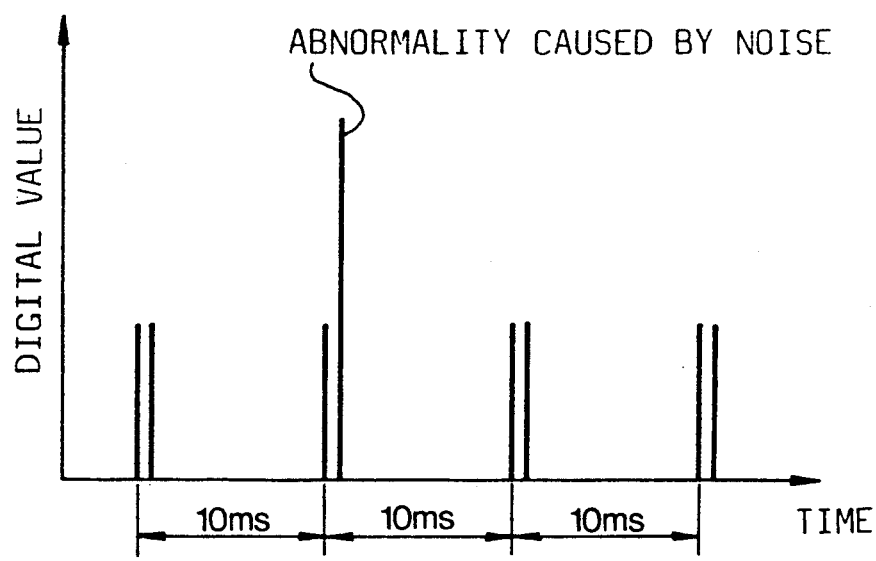
FIG. 3 is a time chart showing analog-to-digital conversion timings.

Referring to FIG. 2, an A/D conversion unit 30 provided in the control unit 19 comprises an input section 31 and an input data determining section 32. The input section 31 has an input timing determining means 31a which feeds a channel select signal to select one of a plurality of channels corresponding to a sensor of the analog sensor group 29 to an A/D conversion means 31b comprising the ADC 23. The input timing determining means 31a also generates two trigger signals or several signals at a predetermined timing for starting the conversion operation so that an analog signal from a particular sensor is converted into a digital signal each time at the timing. For example, as shown in FIG. 3, the output signal of the throttle position sensor 11 is consecutively twice converted to a digital signal at every 10 ms in response to the trigger signals. The digital signals D1, D2 are applied to a memory changeover means 31c to store the digital values D1 and D2 thereof in a memory 31d in the RAM 22 at respective addresses.

The input data determining section 32 has a difference calculator 32a where the difference M1 between the digital values D1 and an old digital value D0 obtained and stored in a memory 32f in the RAM 22 at the last routine of the program and the difference M2 between the digital value D2 and the digital value D0 are respectively calculated. The differences M1 and M2 (absolute values) are stored in a memory 32b in the RAM 22.

The differences M1 and M2 are applied to a comparing means 32c where the differences M1 and M2 are compared with each other. The digital value D1 or D2 corresponding to the smaller one of the two differences M1 and M2 is stored in an address of the memory 31d. An address signal representing the address of the memory 31d is fed from the comparing means 32c to retrieving means 32d is fed to rewriting means 32d retrieves the digital value D1 or D2 from the memory 31d in accordance with the address signal. The digital value D1 or D2 read out from the memory 31d is fed to rewriting means 32e so as to rewrite the digital value D0 in the memory 32f with the newly obtained digital value D1 or D2 of the present routine of the program.

Referring to FIG. 3, since the noise duration is most commonly about 20 μs and the time required for A/D conversion is about 40 μs, one of the two consecutively converted digital signals can be assumed to be without noise.

Figure 4:
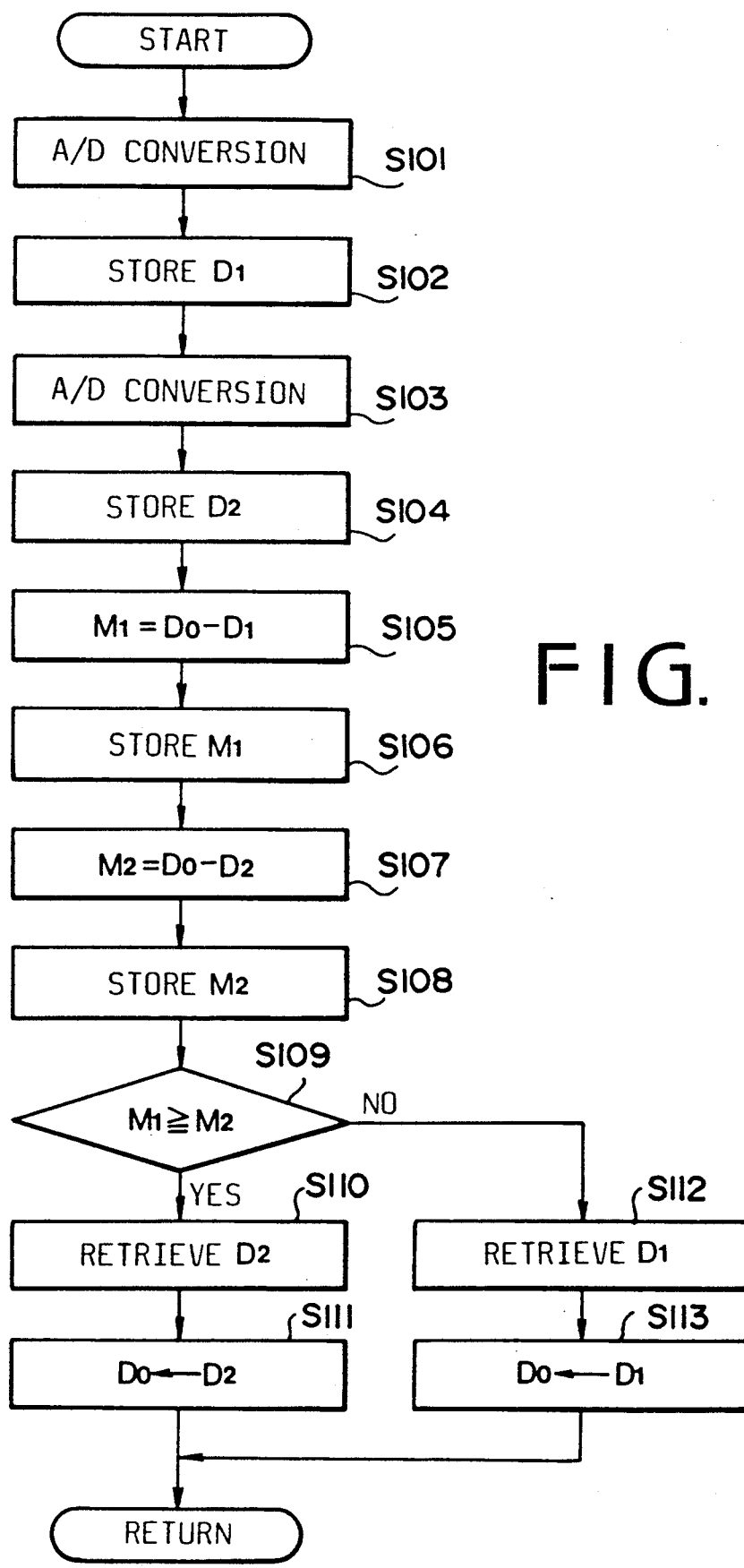
FIG. 4 is a flowchart showing the operation of the present invention.

The operation of the present invention is described with reference to the flowchart of FIG. 4.

At a step S101, the input timing determining section 31a applies the channel select signal to the ADC 23 at a predetermined timing so that the analog signal is fed from one of the sensors, for example, the throttle position sensor 11 to the ADC 23. At the same time, the first trigger signal is fed to the ADC 23, thereby converting the analog signal to the digital signal. The digital value D1 is stored in the RAM 22 at a step S102. At a step S103, the second trigger signal is applied to the ADC 23 so that the analog to digital signal is again converted. The second digital value D2 is also stored in the RAM 22 at a step S104.

At a step S105, the calculator 32a calculates the difference M1 between the first digital value D1 and the old digital value D0 obtained and stored at the last routine of the program, and the difference M1 is stored in the RAM 22 at the predetermined address at a step S106. The second difference M2 between the digital value D2 stored at the step S104 and the old digital value D0 is calculated and stored at steps S107 and S108.

At a step S109, the comparing means 32c compares the differences M1 and M2 with each other. When the first difference M1 is larger than the second difference M2, the program goes to a step S110 where the address of the digital value D2 corresponding to the smaller difference M2 is applied to the retrieving means 32d, and the value D2 is read out from the memory 31d accordingly. The digital value D2 is fed to the rewriting means 32e so that the old digital value D0 in the memory 32f is rewritten with the newly obtained digital value D2 at a step S111.

To the contrary, when the second difference M2 is larger than the first difference M1, the program goes to a step S112 where the first value D1 is read out from the memory 31d in the same manner as at the step S110. Thereafter, the value D1 is stored in the memory 32f instead of the last value D0. Thus, the analog signals of the sensors can be converted into digital signals so as to be processed in the digital system of the control unit 19.

Although in the presently described embodiment, the analog signal is converted to the digital signal twice per input timing, the system may be modified to change the number of conversions dependent on noise duration, frequency of noise, input timing interval and conversion time.

The conversion may be repeated 3 to 4 times at each timing when the noise duration is large. The average of two closer digital values to the old digital value is used as the present digital value.

From the foregoing, it will be understood that the present invention provides an analog to digital conversion system where influences of the noise on the digital value are eliminated without causing a response delay. Thus, errors in electronic control operation of a vehicle are prevented.

While the presently preferred embodiments of the present invention have been shown and described, it is to be understood that various changes and modifications may be made without departing from the scope of the invention as set forth in the appended claims.

What is claimed is:

1. An analog-to-digital conversion system for obtaining digital values for an electronic control system of a motor vehicle having various sensors to detect operating conditions of said motor vehicle and to produce analog signals comprising:

input determining means for generating a select signal to select one of a plurality of channels corresponding to one of said sensors and operating conditions;

converting means responsive to said analog signals and said select signal for converting the analog signal corresponding to said one sensor and operating condition into digital signals at a predetermined timing;

changeover means responsive to said digital signals for storing said digital signals as digital values art respective addresses;

calculating means responsive to said digital values for calculating a difference between a present said digital value at a present time and an old digital value obtained at a previous time and for producing a difference signal;

comparing means responsive to said difference signal for effectively comparing said present digital value with said old digital value in order to select a smallest difference value and for producing a corresponding signal; and retrieving means responsive to said corresponding signal for retrieving as a newly obtained digital value the digital value corresponding to said smallest difference value stored in said respective address, whereby influence of noise in said newly obtained digital value have been eliminated without delay.

2. The system according to claim 1, wherein said input determining means generates at least two consecutive trigger signals at a predetermined timing and said converting means is responsive to said trigger signals to perform said converting of the analog signal into the digital signals, respectively, at each said trigger signal at a predetermined timing.

3. The system according to claim 2, wherein said calculating means calculates: a first difference between a first said present digital value and said old digital value; and a second difference between a second said present digital value and said old digital value, and said comparing means compares said first and second differences to select said smallest difference value of said first and second differences, and said retrieving means retrieves said first or second present digital value corresponding to the smallest difference value of said first and second difference as said newly obtained digital value.

4. The system according to claim 3, wherein said input determining means generates more than two consecutive trigger signals at the predetermined timing for the converting means to perform said converting of the analog signal into the digital signals, respectively, at each said trigger signal at the predetermined timing, and means for determining and averaging two closer of said digital values to said old digital value.

5. An analog-to-digital conversion method for obtaining digital values for an electronic control system of a motor vehicle having various sensors to detect operating conditions of said motor vehicle and to produce analog signals, comprising the steps of:

selecting one of channels corresponding to one of said sensors and operating conditions;

generating a select signal corresponding to said one channel;

converting said analog signal corresponding to said select signal and said one sensor and operating condition into digital signals at a predetermined timing;

storing said digital signals as digital values at respective addresses;

calculating a difference between a present of said digital values at a present time and an old digital value obtained at a previous time;

comparing said present digital value with said old digital value in order to select a smallest difference value; and retrieving as a newly obtained digital value the digital value corresponding to said smallest difference value stored in said respective address, whereby influences of noise in said newly obtained digital value have been eliminated without delay.

* * * * *